United States Patent [19]

Carlson

[11] Patent Number: 4,581,643
[45] Date of Patent: Apr. 8, 1986

[54] DOUBLE CONVERSION TELEVISION TUNER WITH FREQUENCY RESPONSE CONTROL PROVISIONS

[75] Inventor: David J. Carlson, Indianapolis, Ind.

[73] Assignee: RCA Corporation, Princeton, N.J.

[21] Appl. No.: 516,933

[22] Filed: Jul. 25, 1983

[51] Int. Cl.$^4$ .......................... H04N 5/50; H04B 1/26
[52] U.S. Cl. .............................. 358/191.1; 358/195.1; 455/315
[58] Field of Search .............. 358/191.1, 193.1, 195.1; 455/314, 315, 316, 189, 191, 192

[56] References Cited

U.S. PATENT DOCUMENTS

| | | | |
|---|---|---|---|
| 4,031,549 | 6/1977 | Rast | 358/191.1 |
| 4,262,361 | 4/1981 | Hauer | 455/315 |
| 4,385,402 | 5/1983 | Barrs | 455/339 |
| 4,402,089 | 8/1983 | Knight | 455/191 |
| 4,408,348 | 10/1983 | Theriault | 455/315 |
| 4,479,257 | 10/1984 | Akiyama | 455/266 |
| 4,516,078 | 5/1985 | Yanagihara et al. | 328/167 |

OTHER PUBLICATIONS

"Eight Ways to Better Radio Receiver Design", by U. L. Rohde, in Electronics, Feb. 26, 1975.

Primary Examiner—Tommy P. Chin
Attorney, Agent, or Firm—Eugene M. Whitacre; Paul J. Rasmussen; Peter M. Emanuel

[57] ABSTRACT

In a double conversion tuner for a television receiver including a first local oscillator and a first mixer for converting the RF signal corresponding to a selected channel to a first IF signal and a second local oscillator and a second mixer for converting the first IF signal to a second IF signal, control apparatus is coupled to one of the local oscillators for offsetting its frequency and correspondingly the carriers of the first IF signal relative to the passband of a first IF filter coupled between the two mixers. In this manner the amplitude or phase of the carriers of the first IF signal can be controlled. An AFT signal is coupled to the other one of the local oscillators to compensate for the frequency offset of the carriers of the first IF signal in order to tune the carriers of the second IF signal to their nominal frequencies.

17 Claims, 3 Drawing Figures

DOUBLE CONVERSION TELEVISION TUNER WITH FREQUENCY RESPONSE CONTROL PROVISIONS

BACKGROUND OF THE INVENTION

1. Field of the Invention

The present invention concerns a double conversion tuner for a television receiver with provisions for altering the frequencies of the carriers of the first intermediate frequency signal to change their amplitudes or phases.

2. Description of Related Art

From the earliest days of television, it has been known to purposely "misfine tune" a receiver so that the frequencies of carriers in the passband of the IF filter are shifted or offset from their nominal frequencies to change the amplitude of the carriers and thereby subjectively enhance the receivers' video and audio responses. However, because traps and other frequency selective networks, such as those associated with a synchronous demodulator, are set assuming the carriers of the IF signal are at nominal frequencies, misfine tuning the receiver is not particularly desirable.

Rather than controlling the frequencies of the IF carriers, it has also been proposed to control the shape (or "tilt") of the amplitude versus frequency response characteristics of the IF filter section of a television receiver to control the amplitudes of the carriers for various purposes. Among these purposes are compensation for the non-linear amplitude versus frequency response characteristic of the antenna and RF filter section of the television receiver (see U.S. Pat. No. 4,366,498—Theriault), automatic chroma control (see U.S. Pat. Nos. 3,079,461—Keizer, and 2,921,120—Pritchard et al.) and adjustment of the ratio of the luminance and chrominance signals (see U.S. Pat. Nos. 2,934,599—Holmes, and 4,366,498—Theriault). Such prior IF tilt arrangements typically have included variable reactive components such as a varactor diode which add cost and complexity to the IF filter section.

SUMMARY OF THE INVENTION

In accordance with the principal of the present invention, it is recognized that a double conversion tuner affords a unique opportunity to readily control the amplitude and/or phase of the carriers of the IF signal and their associated modulation components.

A double conversion tuner includes a first conversion (or heterodyning) stage, including a local oscillator and a mixer, for converting the RF signal corresponding to a selected channel to a first IF signal and a second conversion stage, including a second oscillator and a second mixer, for converting the first IF signal to a second IF signal corresponding to the conventional IF signal of a single conversion tuner. The frequencies of the first and second oscillators are selected so that the carriers of the second IF signal have frequencies nominally equal to those of a conventional IF signal. Double conversion tuners have the advantage over single conversion tuners in that the passband of the first IF signal can be selected to reduce the possibility of the generation of interference signals.

In a double conversion tuner constructed in accordance with the principles of the present invention, a control unit is provided for offsetting the frequency of one of first and second oscillators from its nominal value. This offsets the frequencies of the carriers of the first IF signal by a corresponding amount with respect to the passband of a first IF filter section. Depending on the amplitude and phase versus frequency characteristics of the first IF filter section, the amplitude and/or phases of the carriers of the first IF signal are changed. Accordingly, the carriers of the second IF signal can be preconditioned as to amplitude and/or phase. The other one of the first and second oscillators is controlled in response to an AFT (automatic fine tuning) signal representing the deviation between the frequency of one of the carriers, e.g., the picture carrier, of the second or conventional IF signal, and its nominal value to establish the frequencies of the carriers of the second IF signal at their respective nominal values.

BRIEF DESCRIPTION OF THE DRAWING

These and other features of the present invention are set forth in the following detailed description of the accompanying Drawing in which.

DETAILED DESCRIPTION OF THE PREFERRED EMBODIMENTS

Figure 1:
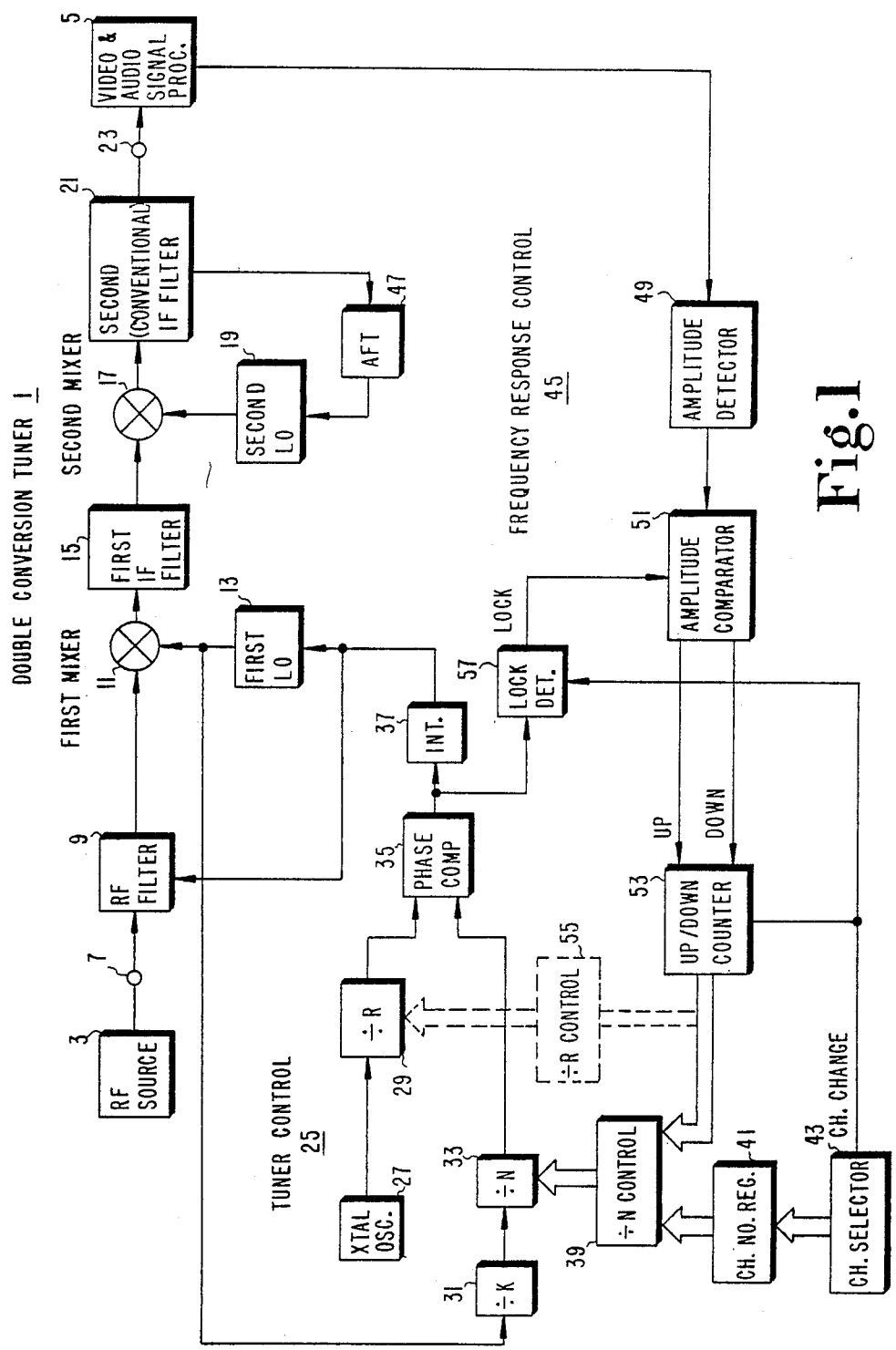
FIGS. 1 and 2 show schematics of alternate embodiments of the present invention.

In the television receiver shown in FIG. 1, a double conversion tuner 1 selects the RF signal corresponding to a selected channel from the plurality of RF signals provided by an RF source 3 and converts the selected RF signal to a corresponding IF signal in the conventional IF frequency range (e.g., in the United States between 41 and 46 mHz). RF source 3 may, for example, comprise a television broadcast receiving antenna, a cable distribution network, a video cassette recorder, a video disc player, or a home computer. The IF signal produced by tuner 1 is demodulated and separated into luminance, synchronization, chrominance and audio components by a video and audio signal processing unit 5. The various components are further processed by video and audio signal processing unit 5 to produce the video and audio responses corresponding to the selected channel.

Double conversion tuner includes an RF input terminal 7 to which the RF source 3 is connected. The RF signals received at terminal 7 are filtered by an RF filter section 9 to select the RF signal corresponding to the selected channel and the resultant RF signal is coupled to a first mixer 11. A first local oscillator (LO) signal having a nominal frequency corresponding to the selected channel is generated by a first LO 13 and also coupled to first mixer 11. First mixer 11 heterodynes the selected RF signal and the first LO signal to produce a first IF signal. First mixer 11 produces the sum and difference frequency products of the first LO signal and the selected RF signal. The first IF signal is coupled to a first IF filter stage 15 which has a passband response selected to pass the difference frequency product of the first LO signal and the selected RF signal. The frequencies of the first LO signal determine the frequency range of the first IF signal and, by way of example, may be selected so that the first IF signal has a frequency range in the gap between the VHF and UHF frequency ranges, e.g., between 411 mHz and 416 mHz, with picture, color, and sound carriers at 415.75 mHz, 412.17 mHz, and 411.25 mHz, respectively.

The filtered first IF signal is coupled to a second mixer 17. A second LO signal generated by a second local LO 19 is also coupled to second mixer 17. Second mixer 17 produces the sum and difference frequency products of the first IF signal and the second LO signal. A second IF filter section 21, having a passband selected to pass the difference frequency product of the first IF signal and the second LO signal, filters the second IF signal. The frequency of the second LO signal determines the frequency range of the second IF signal and is nominally set, e.g., at 370 mHz, so that the second IF signal has the same frequency range as the conventional IF frequency range between 41 and 46 mHz, with the picture, color and sound carriers at 45.75 mHz, 42.17 mHz, and 41.25 mHz, respectively. The filtered second IF signal is coupled to video and audio signal processing unit 5 via an output terminal 23.

The structural details of a double conversion tuner of the type so far described are disclosed, e.g., in U.S. patent application Ser. No. 294,133, entitled "Multiband Tuning System for a Television Receiver," filed in the name of Theriault on Aug. 19, 1981 and assigned to the same assignee as that of the present application and now issued as U.S. Pat. No. 4,408,348.

First LO 13 is a voltage controlled oscillator and RF filter 9 is a voltage controlled filter. These units are controlled in response to the magnitude of a tuning control voltage. The magnitude of the tuning control voltage is controlled in accordance with the selected channel by a tuner control section 25 including a phase locked loop (PLL). In the PLL, the frequency of the output signal of a crystal oscillator 27 is divided by a frequency divider ($\div R$) 29 to produce a frequency reference signal. The PLL also includes a frequency divider ($\div K$) 31 and a frequency divider ($\div N$) 33 for dividing the frequency of the local oscillator signal to produce a frequency divided version of the first LO signal. The frequency reference signal and the frequency divider local oscillator signal are compared by a phase comparator 35 to produce a pulse signal having pulses the width and polarity of which represent the magnitude and sense of frequency deviation between them. The pulse error signal is filtered by an integrator 37, which servies as a low pass filter, to produce the tuning control voltage for first LO 13. The magnitude of the tuning control voltage is changed until the frequency of the frequency reference signal and the frequency divided LO signal are substantially equal. At that point the following frequency relationship exists:

$$f_{LO1} = NK \frac{f_{XTAL}}{R} = NK f_{REF}$$

Division factor R of divider 29 is selected to determine the frequency ($f_{REF}$) of the frequency reference signal. Division factor K of divider 31 is selected to reduce the frequency of the relatively high frequency first LO signal before further processing and determines together with division factor R the factor $$K \frac{f_{XTAL}}{R},$$

which is conventionally selected to equal 1 mHz. Division factor N of divider 33 is controlled by a control unit 39 to set the frequency of the first LO signal in accordance with the binary representation of the channel number of the desired channel stored in a register 41. (With the factor $$K \frac{f_{XTAL}}{R}$$

equal to 1 mHz, N is equal to the frequency, in mHz, of the desired first LO frequency.) The binary representation of the channel number is entered into channel number register 41 in response to a user's operation of a channel selector 43, which may, for example, comprise a calculator-like keyboard by which the user may enter in sequence the tens and units digits of the channel number of the desired channel.

Figure 3:
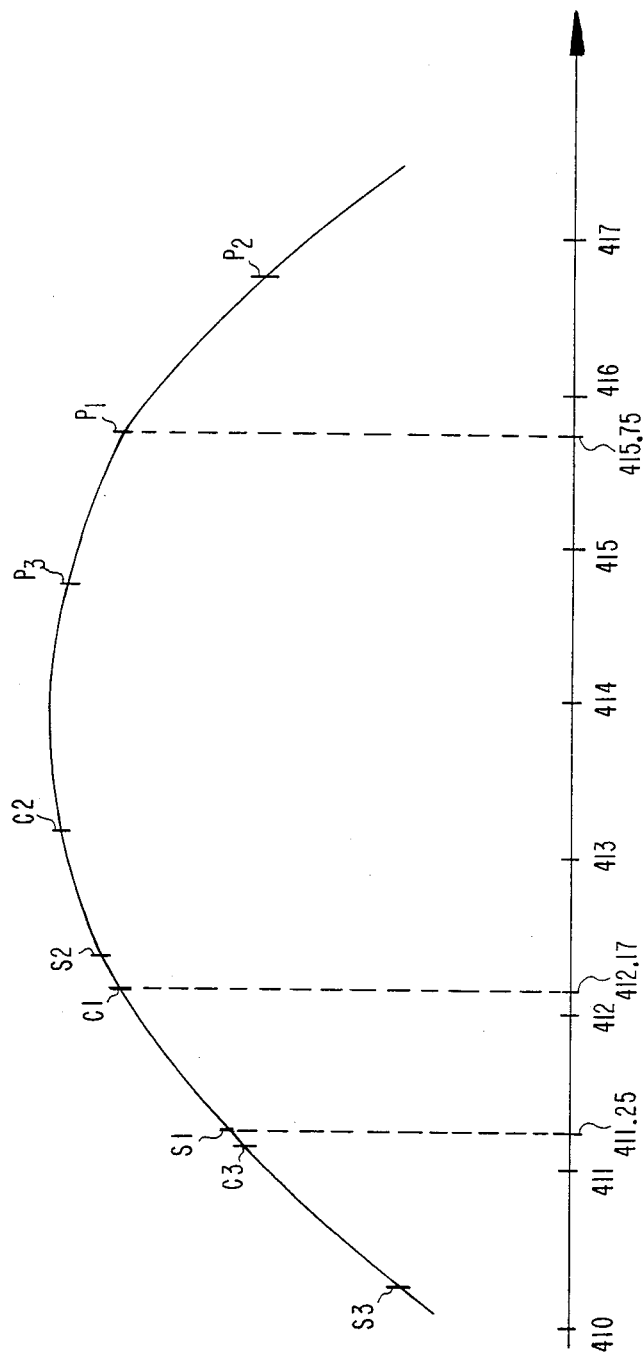
FIG. 3 shows an amplitude versus frequency characteristic useful in understanding the embodiments of FIGS. 1 and 2.

In accordance with an aspect of the present invention, frequency response control apparatus 45 is coupled to first LO 13 for offsetting the frequency of the first LO signal away from the frequency required to place the carriers of the first IF signal at their respective nominal frequencies in order to change the amplitudes of the carriers and their associated modulation components. This can better be understood with reference to FIG. 3 in which the amplitude versus frequency response of first IF filter section 15 is shown. The nominal frequency locations of the picture, color, and sound carriers of the first IF signal are indicated by the designations $P_1$, $C_1$, and $S_1$, respectively. When the frequency of the first LO signal is increased, e.g., by 1 mHz, the frequency of the carriers are correspondingly increased as is indicated by the designations $P_2$, $C_2$ and $S_2$. As is shown, in this condition, the amplitudes of the color and sound carriers are increased and the amplitude of the picture carrier is decreased. As is indicated by the designations $P_3$, $C_3$ and $S_3$, when the frequency of the first local oscillator signal is decreased, e.g., by 1 mHz, the amplitude of the picture carrier is increased and the amplitudes of the sound and color carriers are decreased.

In order to correct for the frequency shift of the carriers the first IF signal from their nominal frequencies so that the carriers of the second IF signal are tuned to their nominal frequencies, an automatic fine tuning (AFT) voltage generated by an AFT unit 47 is coupled to second LO 19 which is also a voltage controlled oscillator. The AFT voltage represents by its magnitude and polarity the magnitude and sense, respectively, of the deviation between the frequency of the picture carrier of the second IF signal and its nominal value, e.g., 45.75 mHz. Second LO 19 responds to the AFT signal to change its frequency to compensate for the frequency shift of the carriers of the first IF signal. Thus, while the amplitudes of the carriers of the first IF signals are changed, the frequencies of the carriers of the second IF signal are maintained at their proper values.

Frequency response control unit 45 may, for example, simply comprise a manual arrangement by which the value of division factor N of divider 33 is increased or decreased until this picture is subjectively improved. Alternately, it may comprise an automatic system by which the amplitude of a predetermined component of the television signals processed in video and audio signal processing unit 5 is detected and used to derive a frequency response control signal for controlling the frequency of the first LO signal.

For the latter purpose, as is shown in FIG. 1, an amplitude detector 49 is coupled to video and audio signal processing section 5 for generating a DC level representing the amplitude of, e.g., one of the luminance or chrominance components. By way of example, the amplitude of the color burst may be detected for automatically controlling the amplitude of the chrominance component. This may be simply accomplished as is, for example, disclosed in U.S. Pat. No. 4,366,498 entitled "I.F. Response Control System For a Television Receiver," issued in the name of Theriault on Dec. 28, 1982, by gating out the color burst component and detecting its amplitude. An amplitude comparator 51 compares the DC level generated by amplitude detector 49 to a threshold level for generating an "up" control signal when the amplitude of the DC level is above threshold level by a predetermined amount, and a "down" control signal when amplitude of the DC level is below the threshold level by the predetermined amount. The up and down signals are coupled to an up-down counter 53 and cause its contents to increase or decrease, respectively. The contents of up and down counter 53 are coupled to $\div N$ control unit 39 to change its contents and thereby the frequency of the first LO signal.

Other frequency dividers of the PLL may be controlled to control the frequency of the first LO signal. For example, as indicated by the dashed lines in FIG. 1, the contents of up-down counter 53 may be coupled to a control unit 55 for controlling division factor R of divider 29. Any one of a number of wellknown arrangements for controlling the frequency dividers of a PLL tuner control system such as disclosed in U.S. Pat. Nos. 3,980,951, 4,025,953, and 4,357,632 may be employed in the arrangement of FIG. 1.

Since the amplitude of the signal detected by amplitude detector 49 is not reliable until the operation of tuner control section 25 has been stabilized, amplitude comparator 51 of frequency response control unit 45 is disabled from generating the up and down control signals until the operation of tuner control section 25 has been stabilized in the following manner.

When a new channel is selected, a channel change signal signal is generated by channel selector 43. In response to the channel change signal, a lock detector 53 is reset and up/down counter 53 is set to a count corresponding to the nominal frequency of the first LO signal. Thereafter, lock detector 57 is enabled to sense the width of the error pulses generated by phase comparator 35 to determine when the frequencies of the frequency divided LO signal and the frequency reference signal are substantially equal after a new channel is selected. At that point, lock detector 57 generates a lock signal which is coupled to amplitude comparator 51 to enable it to generate the up and down control signals.

Figure 2:
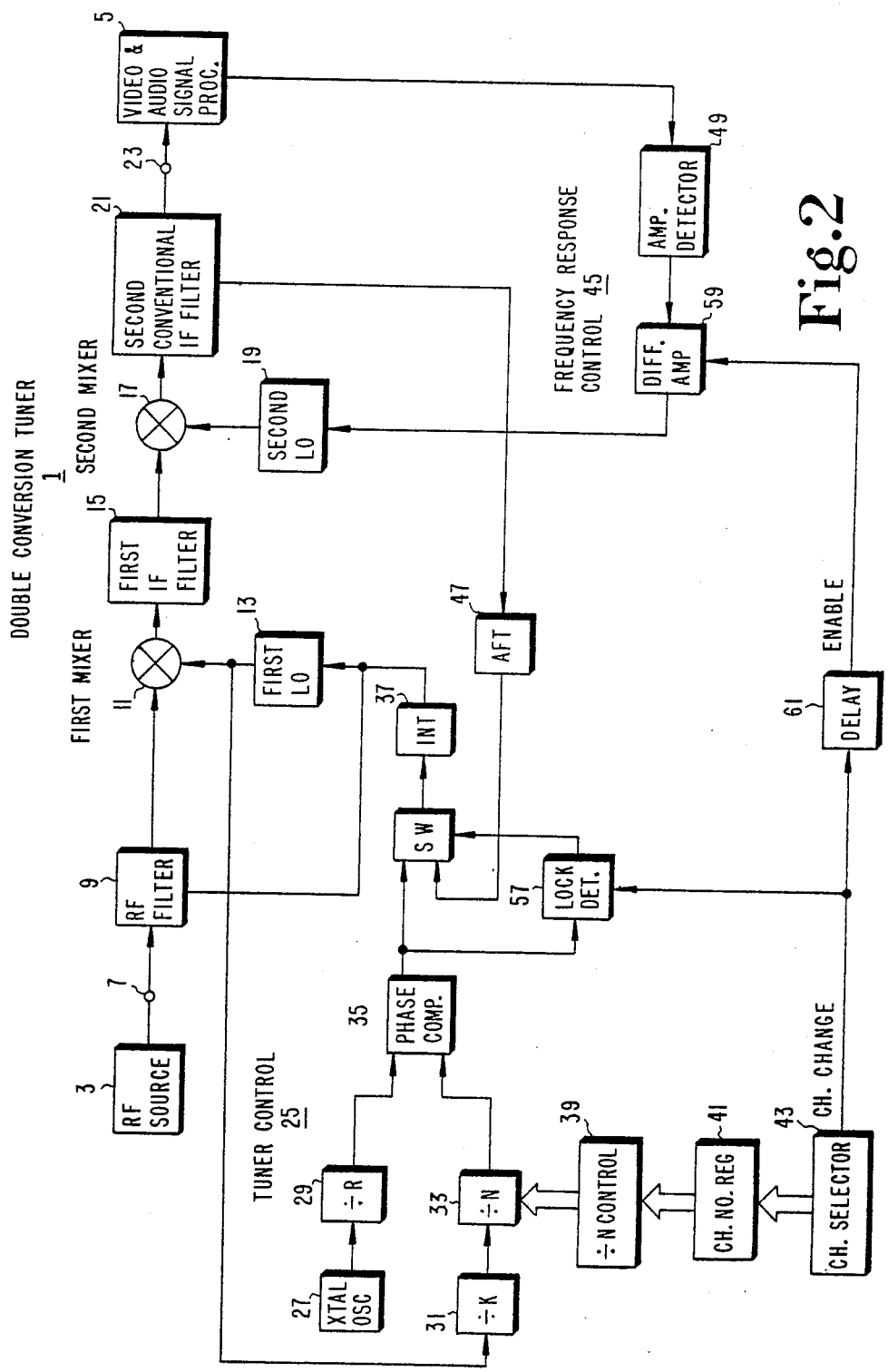

Frequency response control unit 45 may also be disabled until the operation of tuner control unit 25 is stabilized after the selection of a new channel by generating an enabling signal only after a time delay corresponding to the settling time of tuner control unit 25 after the generation of the channel change signal as is indicated in FIG. 2.

In the alternate embodiment of the present invention for offsetting the frequencies of the carriers of the first IF signal from their nominal values in order to control the amplitudes of the carriers and their associated modulation components shown in FIG. 2, the frequency of the second LO signal is controlled by the frequency response control unit and the frequency of the first LO signal is controlled by the AFT voltage. Similar portions of the embodiments of FIG. 1 and 2 are identified by the same reference numbers.

In tuner control section 25 of the embodiment of FIG. 2, when a new channel is selected and lock detector 57 is reset in response to the channel change signal, a switch 59 is caused to couple the output of phase detector 35 to the input of integrator 37 thereby initiating the operation of the PLL. The PLL operates in the same manner as described with reference to FIG. 1. When the operation of the PLL is stabilized and lock detector 57 generates a lock signal, switch 59 is caused to decouple the pulse error signal generated by phase detector 35 from integrator 37 and to couple the AFT voltage from AFT network 47 to integrator 37 instead. At this point, the operation of the PLL is terminated. However, assuming that the frequency of second LO 19 is at its nominal frequency, i.e., that required to place the frequency of the picture carrier of the second IF signal at its nominal value, the AFT voltage causes the frequency of the first LO signal to be maintained at the value established by PLL control.

As earlier noted in the embodiment shown in FIG. 2, in order to control the amplitudes of the carriers of the first IF signal and their associated modulation components, the frequency of the second LO signal is offset from its nominal value (i.e., the frequency required to place the carriers of the second IF signal at their nominal frequencies assuming that the carriers of the first IF signal are at their nominal frequencies). When that occurs, the carriers of the second IF signal are offset from their nominal frequencies and the AFT voltage changes accordingly. The change in the AFT voltage causes the frequency of the first LO signal to be offset from the frequency established by the PLL to compensate for the offset of the frequency of the second LO signal so as to once again place the carriers of the second IF signal at their nominal frequencies. As a result the carriers of the first IF signal are offset from their nominal frequencies. If the frequency of the second LO signal is increased, the frequency of the first LO signal and the frequencies of the carriers of the first IF signal are increased. If the frequency of the second LO signal is decreased, the frequencies of the first LO signal and the frequencies of the carriers of the first IF signal are decreased. These relationships can be seen from the following expressions, with the understanding that the frequencies of the RF and second IF signals remain unchanged in the above operation.

$$f_{IF1} = f_{LO1} - f_{RF}$$

$$f_{IF2} = f_{IF1} - f_{LO2} = f_{LO1} - f_{RF} f_{LO2}$$

The frequency of the second LO signal may simply be manually controlled by means of a user's adjustment of a potentiometer arrangement for supplying a variable DC control level to second LO 19 until the video or audio responses are subjectively improved. Alternately, as shown in FIG. 2, the frequency response control unit may operate to automatically adjust the frequency of the second LO signal in accordance with the characteristics of the baseband signals processed in video and audio signal processing section 5.

In the embodiment of FIG. 2 frequency response control unit 45, as in the embodiment of FIG. 1 comprises, an amplitude detector 49. However, a differential amplifier 59 replaces amplitude comparator 51 of the embodiment of FIG. 1 to provide a DC control voltage to second LO 19 which varies continuously above and below a reference level in accordance with the amplitude of the component sensed by amplitude detector 49. The amplitude representative voltage generated by amplitude detector 49 and a threshold voltage are coupled to respective differential inputs of differential amplifier 59. When the two input voltages are within a predetermined range of each other, the control voltage for second LO 19 is at the reference level. Second LO 19 is designed to oscillate at its nominal frequency, e.g., 370 mHz, in response to the reference level and at higher and lower frequencies in response to levels of the control voltage above and below the reference level.

The control voltage provided by differential amplifier 59 is caused to be at its reference level until the operation of tuner control unit 25 is stabilized after the selection of a new channel. That may simply be accomplished by selectively coupling the aforementioned threshold voltage to both inputs of differential amplifier 59 until an enabling signal signifying the completion of the operation of tuner control unit 25 is generated. To that end, a delay element 61 is provided to generate the enabling signal at a predetermined time delay corresponding to the acquisition time of tuner control unit 25, including AFT network 47, after the channel change signal, as shown in FIG. 2, or alternately after the generation of the lock signal.

For stability reasons, it may be desirable to have second LO 19 controlled by a phase locked loop. In that case, the frequency of second LO 19 may be controlled by changing the division factor of a frequency divider, such as the frequency divider for deriving the frequency reference signal of the PLL, in a manner similar to that disclosed with respect to the PLL of FIG. 1.

The amplitude versus frequency characteristic of first IF filter 15 can be produced by the cascaded arrangement of a double tuned circuit, an amplifier and a triple tuned circuit. Alternately, a surface acoustic wave (SAW) device may be employed for that purpose. The use of a SAW device is desirable since it may be readily designed to provide various amplitude and phase versus frequency characteristics. With respect to the latter, while the frequency response control apparatus has been described in terms of offsetting the carriers of the first IF signal from their nominal frequencies with respect to the amplitude versus frequency characteristics of the first IF filter in order to control the amplitudes of the carriers and their modulation components, similar frequency response control apparatus may be employed for offsetting the carriers of the first IF signal from their nominal frequencies with respect to the phase versus frequency characteristics of the first IF filter to control the phases of the carriers and their modulation components. Thus, the phase versus frequency characteristics of the first IF filter may be shaped in order to allow the phase and group delay characteristics of the baseband components to be controlled by offsetting the frequencies of the carriers of the first IF signal.

Some RF sources such as cable distribution networks introduce frequency offsets in the RF signals they supply due to the demodulation and remodulation of the RF signals in the distribution process. To account for such frequency offsets of the RF signals, a PLL tuner control system for controlling the frequency of the sole LO in a single conversion tuner or the first LO in a double conversion tuner may include apparatus for stepping or offsetting the frequency of the local oscillator to compensate for the frequency offset of an RF signal and thereby tune the carriers of the IF signal or signals toward their nominal frequencies. For example, such step control apparatus is described in U.S. Pat. Nos. 4,031,549 (Rast et al.) and 4,357,632 (French) and includes a counter (referred to as a "step" control counter) for changing the division factor of a $-N$ programmable frequency divider, similar to frequency divider 33. It is contemplated that the frequency response control apparatus for offsetting the carriers of the first IF signal away from their nominal frequencies by controlling the frequency of the first local oscillator as shown in FIG. 1, may be incorporated with such step control counters. In addition, step control apparatus for offsetting the frequency of the first local oscillator in order to compensate for frequency offsets of an RF signal may also be employed in the embodiment shown in FIG. 2.

When step control apparatus for compensating for the frequency offset of an RF signal is employed, the operation of the frequency control apparatus according to the present invention should be enabled after the step control counter has been operated to tune the carriers of the first IF signal toward their nominal frequencies, i.e., after the operation of the tuner control apparatus has been stabilized.

While in the embodiment of FIG. 1, the AFT voltage is shown to be continuously applied to first LO 13, in an arrangement using step control apparatus it may be desirable to selectively apply the AFT voltage to first LO 13 in order to prevent unwanted signals from being tuned in the manner disclosed in U.S. patent application Ser. No. 489,306 filed in the names of Carlson and Tults on April 28, 1983 and assigned to the same assignee as that of the present application.

In addition to the modifications discussed above, other modifications may be made to the present invention which is defined by the following claims.

What is claimed is:

1. In a tuner for tuning RF signals corresponding to respective channels, each of said RF signals having at least one information bearing carrier, including first mixer and first local oscillator means which cooperate for converting the RF signal corresponding to a selected channel to a first IF signal having an information bearing carrier corresponding to that of said selected channel; control means for controlling said first local oscillator means to tune said information bearing carrier of said first IF signal toward a first nominal frequency; first IF filter means with a respective passband characteristic for filtering said first IF signal to produce a filtered first IF signal; second mixer and second local oscillator means which cooperate for converting the filtered first IF signal to a second IF signal having an information bearing carrier corresponding to that of said first IF signal; second IF filter means with respective passband characteristic for filtering said second IF signal to produce a filtered second IF signal; an automatic fine tuning (AFT) means coupled to said second IF filter means for generating an AFT signal representing the frequency deviation between said information bearing carrier of said second IF signal and a second nominal frequency; apparatus comprising:

means for coupling said AFT signal to one of said first and second local oscillator means to control the frequency of the respective local oscillator in order to tune said information bearing carrier of said second IF signal toward said second nominal frequency; and means coupled to the other one of said first and second local oscillator means for controlling the frequency of its respective local oscillator signal to offset the frequency of said information bearing carrier of said first IF signal away from said first nominal frequency.

2. The apparatus recited in claim 1 wherein:
said means for coupling couples said AFT signal to said second local oscillator means; and
said means for offsetting is coupled to said first local oscillator means.

3. The apparatus recited in claim 1 wherein:
said means for coupling couples said AFT signal to said first local oscillator means; and
said means for offsetting is coupled to said second local oscillator means.

4. In a television tuner for tuning channels with respective RF signals with picture, color, and sound carriers, apparatus comprising:
first local oscillator means for generating a first local oscillator signal;
channel selector means for selecting any one of said channels;
first local oscillator control means for controlling the frequency of sAid first local signal in accordance with a channel selected by said channel selector means;
first mixer means responsive to said RF signals and to said first local oscillator signal for generating a first IF signal having picture, color, and sound carriers corresponding to those of the RF signal of said selected channel;
first filter means having a respective passband characteristic encompassing the nominal frequencies of said carriers of said first IF signal for filtering said first IF signal to produce a filter first IF signal;
said first local oscillator control means controlling the frequency of said first local oscillator signal to tune said carriers of said first IF signal toward their respective nominal frequencies;
second local oscillator means for generating a second local oscillator signal;
second mixer means responsive to said filtered first IF signal and said second local oscillator signal for generating a second IF signal with picture, color, and sound carriers corresponding to those of said first IF signal;
second filter means having a respective passband characteristic encompassing the nominal frequencies of said carriers of said second IF signal for filtering said second IF signal to produce a filtered second IF signal;
automatic fine tuning (AFT) means responsive to one of said carriers of said filtered second IF signal for generating an AFT signal representing the frequency deviation between said one of said carriers and its nominal frequency;
coupling means for coupling said AFT signal to one of said first and second local oscillator means for controlling the frequency of its respective local oscillator signal to establish said one of said carriers of said second IF signal at its said nominal frequency; and
offsetting means coupled to the other one of said first and second local oscillator means for controlling the frequency of the respective local oscillator signal so that the carriers of said first IF signal are offset away from their respective frequencies established by said first control means.

5. The apparatus recited in claim 4 wherein:
said AFT means is responsive to said picture carrier of said second IF signal.

6. The apparatus recited in claim 5 wherein:
said coupling means couples said AFT signal to said second local oscillator means; and
said offsetting means is coupled to said first local oscillator means.

7. The apparatus recited in claim 5 wherein:
said coupling means couples said AFT signal to said first local oscillator means; and
said offsetting means is coupled to said second local oscillator means.

8. The apparatus recited in claim 5 wherein:
said offsetting means includes a source of a reference frequency and closed loop controlling means coupled to said source and to said other one of said first and second local oscillator means for establishing a proportional relationship between the frequency of said respective local oscillator signal and said reference frequency, said closed loop controlling means including a controllable frequency divider for controlling the factor of proportionality of said proportional relationship by which the frequency of said respective local oscillator signal of said other one of said first and second local oscillator means is controlled to cause said frequency offset of said carriers of said first IF signal.

9. The apparatus recited in claim 8 wherein:
said closed loop controlling means includes a phase locked loop.

10. The apparatus recited in claim 6 wherein:
said first local oscillator control means includes closed loop controlling means for establishing a proportional relationship between the frequency of said first local oscillator signal and a reference frequency in accordance with the selected channel, said closed loop controlling means including a controllable frequency divider for controlling the factor of proportionality of said proportional relationship; and
said offsetting means includes means coupled to said controllable divider to control the factor of proportionality of said proportional relationship to thereby cause said frequency offset of said carriers of said first IF signal.

11. The apparatus recited in claim 10 wherein:
said closed loop controlling means includes a phase locked loop.

12. The apparatus recited in claim 7 wherein:
said second local oscillator means includes a voltage controllable oscillator having a frequency controlled in response to a control voltage; and
said offsetting means includes means for generating said control voltage.

13. The apparatus recited in claim 4 wherein:
said first IF filter means includes a surface acoustic wave device.

14. The apparatus recited in claim 4 wherein:
said first IF filter means exhibits an amplitude versus frequency characteristic selected so that offsetting the frequencies of said carriers of said first IF signal causes a change in the relative amplitudes of said carriers.

15. The apparatus recited in claim 4 wherein:

said first IF filter means exhibits a phase versus frequency characteristic selected so that offsetting the frequencies of said carriers of said first IF signal causes a change in the relative phases of said carriers.

16. The apparatus recited in claim 4 further including:

demodulation means responsive to said filtered second IF signal for demodulating at least one of said carriers of said first IF signal to produce a respective baseband signal;

amplitude detecting means responsive to said baseband signal for generating a signal representing the amplitude of said baseband signal; and control signal generating means responsive to said amplitude representative signal for generating a control signal for said offsetting means which determines the frequency offset imparted to said carriers of said first IF signal.

17. In a television tuner for tuning channels with respective RF signals with picture, color, and sound carriers, apparatus comprising:

first local oscillator for generating a first local oscillator signal;

channel selector means for selecting any one of said channels;

first local oscillator control means for controlling the frequency of said first local signal in accordance with a channel selected by said channel selector means;

first mixer means responsive to said RF signals and to said first local oscillator signal for generating a first IF signal having picture, color, and sound carriers corresponding to those of the RF signal of said selected channel;

first filter means having a respective passband characteristic with nominal frequency locations for said carriers of said first IF signal for filtering said first IF signal to produce a filtered first IF signal;

said first local oscillator control means controlling the frequency of said first local oscillator signal to tune the frequencies of said carriers of said first IF signal toward their respective nominal frequency locations;

second local oscillator means for generating a second local oscillator signal;

second mixer means responsive to said filtered first IF signal and said second local oscillator signal for generating a second IF signal with picture, color, and sound carriers corresponding to those of said first IF signal;

second filter means having a respective passband characteristic with nominal frequency locations for said carriers of said second IF signal for filtering said second IF signal to produce a filtered second IF signal;

demodulation means responsive to said filtered second IF signal for demodulating at least one of said carriers of said first IF signal to produce a respective baseband signal;

automatic fine tuning (AFT) means responsive to one of said carriers of said filtered second IF signal for generating an AFT signal representing the frequency deviation between it and its said nominal frequency;

coupling means for coupling said AFT signal to one of said first and second local oscillator means for controlling the frequency of its respective local oscillator signal to establish said one of said carriers of said second IF signal at its nominal frequency;

offsetting means coupled to the other one of said first and second local oscillator means for controlling the frequency of the respective local oscillator signal in response to a control signal so that the carriers of said first IF signal are offset away from their respective frequencies established by said first control means;

amplitude detecting means responsive to said baseband signal for generating a signal representing the amplitude of said baseband signal; and control signal generating means responsive to said amplitude representative signal for generating said control signal.

* * * * *